US012642143B2

(12) United States Patent (10) Patent No.: US 12,642,143 B2
Zhou et al. (45) Date of Patent: May 26, 2026

(54) LED DISPLAY PIXEL STRUCTURE, LED DISPLAY MODULE, AND LED DISPLAY SCREEN

(71) Applicant: Shenzhen Time Waying Technology Co., Ltd., Shenzhen (CN)

(72) Inventors: Yongye Zhou, Shenzhen (CN); Yanlong Li, Shenzhen (CN)

(73) Assignee: Shenzhen Time Waying Technology Co., Ltd., Shenzhen (CN)

( * ) Notice: Subject to any disclaimer, the term of this patent is extended or adjusted under 35 U.S.C. 154(b) by 551 days.

(21) Appl. No.: 18/191,006

(22) Filed: Mar. 28, 2023

(65) Prior Publication Data

US 2023/0238367 A1 Jul. 27, 2023

Related U.S. Application Data

(63) Continuation of application No. PCT/CN2021/109681, filed on Jul. 30, 2021.

(30) Foreign Application Priority Data

Sep. 28, 2020 (CN) .......................... 202022179818.8
Sep. 28, 2020 (CN) .......................... 202022182230.8

(51) Int. Cl.
*H10W 90/00* (2026.01)
*H10H 20/855* (2025.01)
(52) U.S. Cl.
CPC .......... *H10W 90/00* (2026.01); *H10H 20/855* (2025.01)
(58) Field of Classification Search
CPC ...... H01L 25/0753; H01L 25/167; G09F 9/33

USPC ...................................................... 257/88–89
See application file for complete search history.

(56) References Cited

U.S. PATENT DOCUMENTS

| 2013/0201427 A1* | 8/2013 | Chen ...................... G02B 30/25 |
| | | 349/61 |
| 2018/0357462 A1* | 12/2018 | Mackey ................ H01L 25/167 |
| 2023/0178526 A1* | 6/2023 | Li ......................... G02B 5/3033 |
| | | 257/88 |

FOREIGN PATENT DOCUMENTS

| CN | 102789063 A | 11/2012 |
| CN | 206248865 U | 6/2017 |
| CN | 110969955 A | 4/2020 |

(Continued)

OTHER PUBLICATIONS

International Search Report of PCT Patent Application No. PCT/CN2021/109681 issued on Sep. 29, 2021.

*Primary Examiner* — Eliseo Ramos Feliciano
*Assistant Examiner* — Mikka Liu

(57) ABSTRACT

Provided are an LED display pixel structure, an LED display module, and an LED display screen. The LED display pixel structure includes an LED pixel unit (1) and a layered extraction structure arranged above the LED pixel unit (1). The layered extraction structure is configured to receive light from the LED pixel unit (1) and emit the light. The LED display pixel structure includes a first retardation film layer (31), a linear polarizer (32), and a second retardation film layer (33), which are sequentially stacked. The light emitted by the LED pixel unit (1) sequentially passes through the first retardation film layer (31), the linear polarizer (32), and the second retardation film layer (33). The first retardation film layer (31) and the second retardation film layer (33) are quarter-wave plates.

19 Claims, 3 Drawing Sheets

(56)         References Cited

FOREIGN PATENT DOCUMENTS

KR        20180057586  A        5/2018

* cited by examiner 331    332    221

33

332    331

LED DISPLAY PIXEL STRUCTURE, LED DISPLAY MODULE, AND LED DISPLAY SCREEN

CROSS-REFERENCE TO RELATED APPLICATIONS

This application is a Continuation Applications of PCT Application No. PCT/CN2021/109681, filed on Jul. 30, 2021, which claims priority to Chinese Patent Application Nos. 202022179818.8 and 202022182230.8, both filed on Sep. 28, 2020, the entire contents of which are hereby incorporated by reference.

TECHNICAL FIELD

The present disclosure relates to the field of light-emitting diode (LED) display technology, and more particularly relates to an LED display pixel structure, an LED display module, and an LED display screen.

DESCRIPTION OF THE PRIOR ART

Stereoscopic display techniques are used to create parallax in the left eye and the right eye of a human by artificial means, and to send two images with a certain parallax to the left eye and the right eye, respectively, so that the brain, after acquiring different images seen by the left eye and the right eye, produces a sensation of observing a real three-dimensional object. The LED display technology has advantages of high brightness, large viewing angle, low operating voltage, small power consumption, long lifetime, good impact resistance, and the like, which are incomparable to other display technologies, and can meet the needs of a variety of different application scenarios. Current LED display technology has also gradually entered the field of stereoscopic display, bringing a completely new visual experience. However, existing LED display screens have poor 3D effects and are susceptible to ambient light.

SUMMARY OF THE DISCLOSURE

The technical problem to be solved by the embodiment of the invention is to provide an LED display pixel structure, an LED display module, and an LED display screen, which are intended to solve the problem of existing LED display screens having poor 3D effect and being susceptible to ambient light.

An embodiment of the present disclosure is implemented as such, an LED display pixel structure, including an LED pixel unit and a layered extraction structure arranged above the LED pixel unit, the layered extraction structure configured to receive light from the LED pixel unit and emit the light, the layered extraction structure including a first retardation film layer, a linear polarizer and a second retardation film layer, which are sequentially stacked, the light emitted by the LED pixel unit sequentially passing through the first retardation film layer, the linear polarizer, and the second retardation film layer, the first retardation film layer and the second retardation film layer being quarter-wave plates.

Further, the second retardation film layer includes a first polarization region and a second polarization region, the LED pixel unit includes a first LED pixel unit and a second LED pixel unit, the first polarization region and the second polarization region correspond to the first LED pixel unit and the second LED pixel unit, respectively, a polarization state of the first polarization region is orthogonal to the polarization state of the second polarization region.

Further, an absorption axis of the linear polarizer is at an angle of 45° and −45° respectively to a retardation axis of the first polarization region and a retardation axis of the second polarization region, and the light having passed through the linear polarizer forms a left-handed circularly polarized light and a right-handed circularly polarized light respectively after passing through the first polarization region and the second polarization region.

Further, the first polarization region and the second polarization region are distributed in an array arrangement; or the first polarization region and the second polarization region are alternately arranged in a row direction, and the first polarization region and the second polarization region are alternately arranged in a column direction.

Further, a retaining wall is provided between two adjacent LED pixel units.

Further, the LED display pixel structure further includes a diffusion layer disposed between the LED pixel unit and the layered extraction structure, the diffusion layer includes an inner optical surface facing the LED pixel unit and an outer optical surface opposite to the inner optical surface, the light emitted by the LED pixel unit pass sequentially through the inner optical surface and the outer optical surface, the outer optical surface has a flat surface and the outer optical surface is provided with a Fresnel lens structure, the inner optical surface has a non-smooth rough surface structure, the diffusion layer is made of a transparent optical material.

Further, the diffusion layer has a thickness between 0.5 mm and 10 mm.

Further, a plurality of recessed structures spaced apart are provided on the inner optical surface; or a plurality of projections spaced apart are provided on the inner optical surface.

An embodiment of the present disclosure also provides an LED display module including the LED display pixel structure as described above.

An embodiment of the present disclosure also provides an LED display screen including an LED display module as described above.

Compared to the prior art, the beneficial effects of the present disclosure are that: the LED display pixel structure of the present disclosure includes a layered extraction structure, the layered extraction structure includes a first retardation film layer, a line polarizer, and a second retardation film layer, which are sequentially stacked, the light emitted by the LED pixel unit may be converted to circularly polarized light after passing through the layered extraction structure, which helps to improve the 3D effect, and external light reflected back after passing through the second retardation film layer, the linear polarizer, and the first retardation film layer becomes the light that cannot pass through the linear polarizer, thereby reducing the light reflection rate.

DESCRIPTION OF EMBODIMENTS

Figure 1:
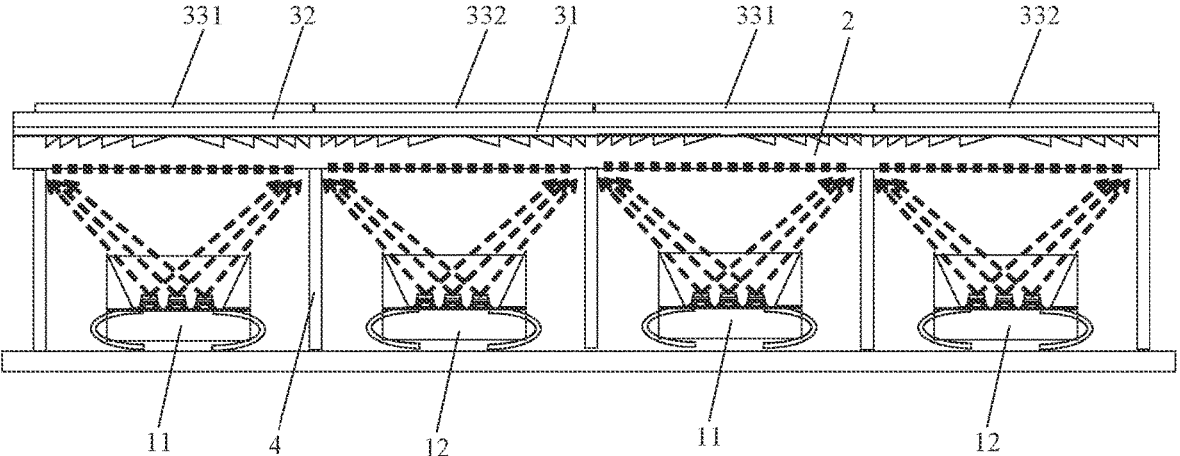
FIG. 1 is a schematic illustration of the structure of an LED display pixel structure according to an embodiment of the present disclosure.
Figures 2, 3:
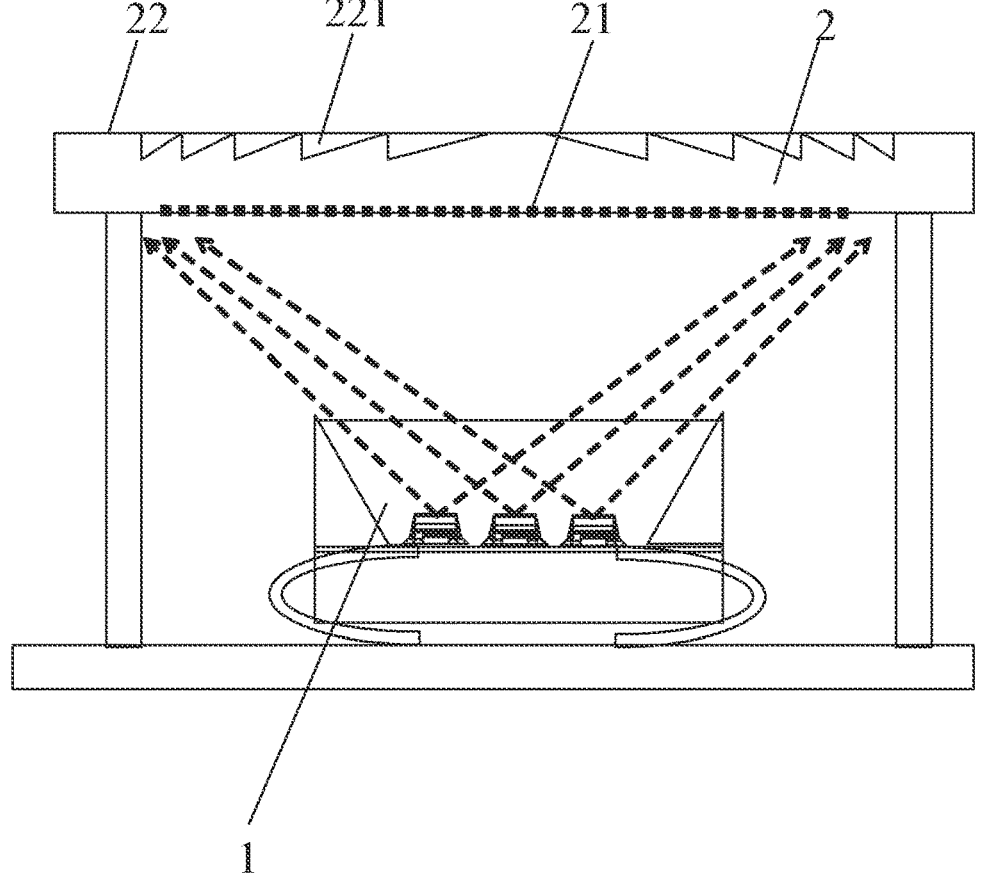
FIG. 2 is a schematic cross-sectional view illustrating structure of the layered extraction structure of FIG. 1.
FIG. 3 is a schematic illustration of the structure of the diffusion layer and the LED pixel unit in FIG. 1.

In order that the objects, technical solutions and advantages of the present disclosure will become more apparent, the present disclosure will now be described in further detail below with reference to the accompanying drawings and embodiments. It should be understood that the specific embodiments described herein are merely illustrative of the invention and are not intended to limit the invention.

As shown in FIGS. 1-4, an LED display pixel structure provided by an embodiment of the present disclosure includes an LED pixel unit 1 and a layered extraction structure arranged over the LED pixel unit 1, the layered extraction structure is configured to receive light from the LED pixel unit 1 and emit the light. The layered extraction structure includes a first retardation film layer 31, a linear polarizer 32 and a second retardation film layer 33, which are sequentially stacked, the light emitted by the LED pixel unit 1 sequentially passes through the first retardation film layer 31, the linear polarizer 32, and the second retardation film layer 33, the first retardation film layer 31 and the second retardation film layer 33 are quarter-wave plates.

The light emitted by the LED pixel unit 1 may be converted to circularly polarized light after passing through the layered extraction structure, which helps to improve the 3D effect, and external light reflected back after passing through the second retardation film layer 33, the linear polarizer 32, and the first retardation film layer 31 cannot pass through the linear polarizer 32 again because the polarization direction has been changed, thereby reducing the light reflect rate. In this embodiment, a retardation axis of the first retardation film layer 31 and an absorption axis of the linear polarizer 32 form an angle of 45° or −45°.

Further, the second retardation film layer 33 includes a first polarization region 331 and a second polarization region 332, the LED pixel unit 1 includes a first LED pixel unit 11 and a second LED pixel unit 12, the first polarization region 331 and the second polarization region 332 correspond to the first LED pixel unit 11 and the second LED pixel unit 12, respectively, a polarization state of the first polarization region 331 is orthogonal to the polarization state of the second polarization region 332. Specifically, the absorption axis of the linear polarizer 32 is at an angle of 45° and −45° to the retardation axis of the first polarization region 331 and the retardation axis of the second polarization region 332, respectively, and light having passed through the linear polarizer 32 forms a left-handed circularly polarized light and a right-handed circularly polarized light respectively after passing through the first polarization region 331 and the second polarization region 332, thereby achieving a 3D effect.

Figure 4:
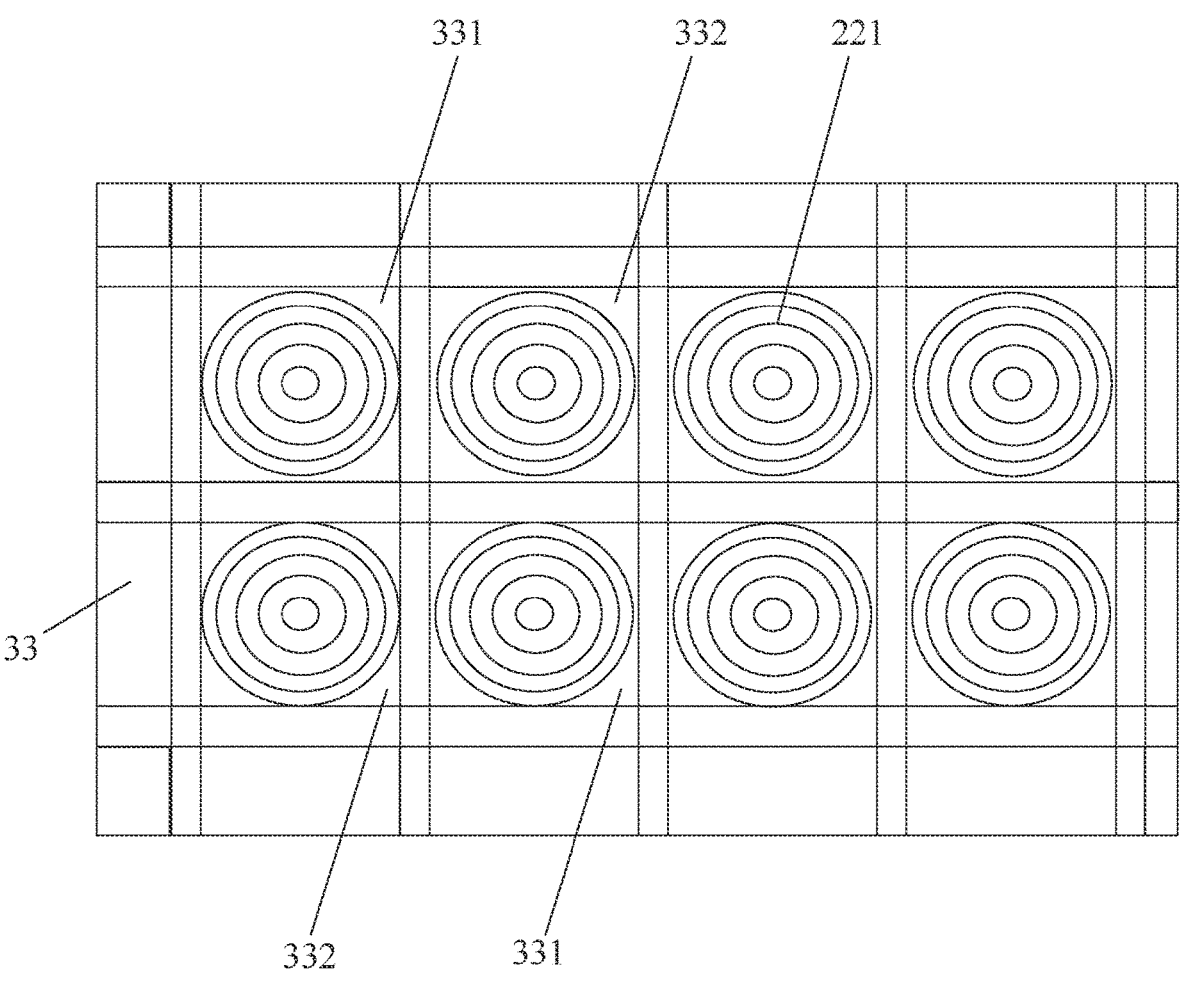
FIG. 4 is a schematic illustration of a partial structure of the first polarization region and the second polarization region according to an embodiment of the invention.

In this embodiment, the first polarization region 331 and the second polarization region 332 are distributed in an array arrangement. In other possible embodiments, as shown in FIG. 4, the first polarization region 331 and the second polarization region 332 are alternately arranged in a row direction and the first polarization region 331 and the second polarization region 332 are alternately arranged in a column direction. Of course, the first polarization region 331 and the second polarization region 332 are not limited to such an arrangement, for example, the first polarization region 331 may be arranged sequentially in the row direction, the second polarization region 332 may arranged sequentially in the row direction, and the first polarization region 331 and the second polarization region 332 may be alternately arranged in the column direction; as another example, it is also possible that the first polarization regions 331 may be sequentially arranged in the column direction, the second polarization regions 332 may be sequentially arranged in the column direction, and the first polarization regions 331 and the second polarization regions 332 may be alternately arranged in the row direction. In addition, the second retardation film layer 33 is prepared by photo alignment processes, thereby forming a first polarization region 331 and a second polarization region 332 having different polarization properties.

Preferably, the LED display pixel structure of the present embodiment further includes a diffusion layer 2 disposed between the LED pixel unit 1 and the layered extraction structure, the diffusion layer 2 includes an inner optical surface 21 facing the LED pixel unit 1 and an outer optical surface 22 opposite to the inner optical surface 21, the light emitted by the LED pixel unit 1 passes sequentially through the inner optical surface 21 and the outer optical surface 22, the outer optical surface 22 has a flat surface and the outer optical surface 22 is provided with a Fresnel lens structure 221, i.e. a plurality of concentric circular serrated grooves arranged by size from small to large are formed, the inner optical surface 21 has a non-smooth rough surface structure, the diffusion layer 2 is made of a transparent optical material. Since the outer optical surface 22 of the diffusion layer 2 has a flat surface, a 3D polarizing film layer may be provided on the outer optical surface 22, a flat surface structure may also reduce reflection of external light by the outer optical surface 22. Moreover, the diffusion layer 2 made of a transparent optical material may increase the transmittance of the light and avoid wasting light energy, and in combination with the non-smooth rough surface structure of the inner optical surface 21, the outer optical surface 22 of the diffusion layer 2 may enhance the diffusion effect of the light and increase the plumpness of a light emitting spot of the LED pixel, due to the formation of the Fresnel lens structure 221.

The main light reflection effect of the diffusion layer 2 is created at the surface of the Fresnel lens structure 221 of the outer optical surface 22, when ambient light is incident on the surface of the Fresnel lens structure 221 through a circular polarizer structure formed by the linear polarizer 32 and the first retardation film layer 31, upon reflection, the circular polarization state of the reflected light becomes orthogonal to the polarization state of the circular polarizer structure, so the reflected light is absorbed when transmitting through the circular polarizer structure formed by the linear polarizer 32 and the first retardation film layer 31, thereby further reducing reflection.

In this embodiment, the diffusion layer 2 has a thickness of 0.5 mm to 10 mm, which allows for sufficient diffusion of light within the diffusion layer 2, thereby further enhancing the diffusion effect of the light. Alternatively, the material of the diffusion layer 2 may be optical glass, PMMA polymethyl methacrylate, PC Polycarbonate or the like, and this embodiment doesn't limit the material of the diffusion layer 2, as long as light transmission can be achieved.

A plurality of recessed structures irregularly spaced apart are provided on the inner optical surface 21 of the diffusion layer 2 so that the inner optical surface 21 forms a non-smooth rough surface structure, and in other possible embodiments, a plurality of projections irregularly spaced apart may also be provided on the inner optical surface 21 so that a rough effect can likewise be formed on the inner optical surface 21. In this implementation, the recessed structures or projections have a size of 5-200 m.

In addition, in this embodiment, the LED display pixel structure also includes a retaining wall 4 disposed between two adjacent LED pixel units 1, specifically between two adjacent first LED pixel units 11, between two adjacent second LED pixel units 12, and between adjacent first LED pixel unit 11 and second LED pixel unit 12, which may reduce light crosstalk between pixel points. The retaining wall 4 may be formed integrally, i.e., the retaining wall 4 forms a plurality of square cells distributed in an array arrangement within which the first LED pixel cells 11 and the second LED pixel cells 12 are housed. In other possible embodiments, the retaining wall 4 may also be formed by separate pieces, i.e., each retaining wall 4 has a rectangular ring structure housing a separate one of the first LED pixel unit 11 or the second LED pixel unit 12.

Embodiments of the present disclosure also provide an LED display module including the LED display pixel structure of the above technical solutions.

Embodiments of the present disclosure also provide an LED display screen including the LED display module of the above technical solutions.

In conclusion, the layered extraction structure of the present disclosure includes the first retardation film layer 31, the line polarizer 32 and the second retardation film layer 33, which are sequentially stacked, the light emitted by the LED pixel unit 1 may be converted to circularly polarized light after passing through the layered extraction structure, which helps to improve the 3D effect, and the light reflected back after passing through the second retardation film layer 33, the linear polarizer 32, and the first retardation film layer 31 become light that cannot pass through the linear polarizer 32, thereby reducing the light reflect rate.

The foregoing descriptions are merely preferred embodiments of the present disclosure and is not intended to limit the present disclosure, any modifications, equivalents, and improvements made within the spirit and principles of the present disclosure are intended to be included within the scope of the present disclosure.

The invention claimed is:

1. A light-emitting diode (LED) display pixel structure, comprising an LED pixel unit (1) and a layered extraction structure arranged above the LED pixel unit (1);

wherein the layered extraction structure is configured to receive light from the LED pixel unit (1) and emit the light, and the layered extraction structure comprises a first retardation film layer (31), a linear polarizer (32) and a second retardation film layer (33), which are sequentially stacked;

the light emitted by the LED pixel unit (1) sequentially passes through the first retardation film layer (31), the linear polarizer (32), and the second retardation film layer (33), and the first retardation film layer (31) and the second retardation film layer (33) are quarter-wave plates; and the second retardation film layer (33) comprises a first polarization region (331) and a second polarization region (332), and the LED pixel unit (1) comprises a first LED pixel unit (11) and a second LED pixel unit (12); the first polarization region (331) and the second polarization region (332) correspond to the first LED pixel unit (11) and the second LED pixel unit (12), respectively; and a polarization state of the first polarization region (331) is orthogonal to a polarization state of the second polarization region (332).

2. The LED display pixel structure of claim 1, wherein an absorption axis of the linear polarizer (32) is at an angle of 45° and −45° respectively to a retardation axis of the first polarization region (331) and a retardation axis of the second polarization region (332), and the light having passed through the linear polarizer (32) forms a left-handed circularly polarized light and a right-handed circularly polarized light respectively after passing through the first polarization region (331) and the second polarization region (332).

3. An LED display module, wherein the LED display module comprises the LED display pixel structure according claim 2.

4. The LED display pixel structure of claim 1, wherein the first polarization region (331) and the second polarization region (332) are distributed in an array arrangement; or the first polarization region (331) and the second polarization region (332) are alternately arranged in a row direction, and the first polarization region (331) and the second polarization region (332) are alternately arranged in a column direction.

5. An LED display module, wherein the LED display module comprises the LED display pixel structure according claim 4.

6. The LED display pixel structure of claim 1, wherein a retaining wall (4) is provided between two adjacent LED pixel units (1).

7. An LED display module, wherein the LED display module comprises the LED display pixel structure according claim 6.

8. An LED display screen, wherein the LED display screen comprises the LED display module of claim 7.

9. The LED display pixel structure of claim 1, wherein the LED display pixel structure further comprises a diffusion layer (2) disposed between the LED pixel unit (1) and the layered extraction structure, the diffusion layer (2) comprises an inner optical surface (21) facing the LED pixel unit (1) and an outer optical surface (22) opposite to the inner optical surface (21), the light emitted by the LED pixel unit (1) passes sequentially through the inner optical surface (21) and the outer optical surface (22), the outer optical surface (22) has a flat surface and the outer optical surface (22) is provided with a Fresnel lens structure (221), the inner optical surface (21) has a non-smooth rough surface structure, the diffusion layer (2) is made of a transparent optical material.

10. The LED display pixel structure of claim 9, wherein the diffusion layer (2) has a thickness between 0.5 mm and 10 mm.

11. An LED display module, wherein the LED display module comprises the LED display pixel structure according claim 10.

12. The LED display pixel structure of claim 9, wherein a plurality of recessed structures spaced apart are provided on the inner optical surface (21); or a plurality of projections spaced apart are provided on the inner optical surface (21).

13. An LED display module, wherein the LED display module comprises the LED display pixel structure according claim 12.

14. An LED display module, wherein the LED display module comprises the LED display pixel structure according claim 9.

15. An LED display screen, wherein the LED display screen comprises the LED display module of claim 14.

16. An LED display module, wherein the LED display module comprises the LED display pixel structure according claim 1.

17. An LED display screen, wherein the LED display screen comprises the LED display module of claim 16.

18. An LED display module, comprising an LED display pixel structure;

wherein the LED display pixel structure comprises:

an LED pixel unit (1);

a layered extraction structure arranged above the LED pixel unit (1), wherein the layered extraction structure is configured to receive light from the LED pixel unit (1) and emit the light, and the layered extraction structure comprises a first retardation film layer (31), a linear polarizer (32) and a second retardation film layer (33), which are sequentially stacked, wherein the light emitted by the LED pixel unit (1) sequentially passes through the first retardation film layer (31), the linear polarizer (32), and the second retardation film layer (33), and wherein the first retardation film layer (31) and the second retardation film layer (33) are quarter-wave plates; and a diffusion layer (2) disposed between the LED pixel unit (1) and the layered extraction structure, wherein the diffusion layer (2) comprises an inner optical surface (21) facing the LED pixel unit (1) and an outer optical surface (22) opposite to the inner optical surface (21), and the light emitted by the LED pixel unit (1) passes sequentially through the inner optical surface (21) and the outer optical surface (22), wherein the outer optical surface (22) has a flat surface, and the outer optical surface (22) is provided with a Fresnel lens structure (221), and wherein the inner optical surface (21) has a non-smooth rough surface structure, and the diffusion layer (2) is made of a transparent optical material.

19. An LED display screen, wherein the LED display screen comprises the LED display module of claim 18.

\* \* \* \* \*